United States Patent
Albicker

(10) Patent No.: US 7,274,918 B1
(45) Date of Patent: Sep. 25, 2007

(54) APPARATUS FOR AUTOMATICALLY FINDING AN AM RADIO PROGRAM

(75) Inventor: Bernhard Albicker, Karlsbad (DE)

(73) Assignee: Harman Becker Automotive Systems GmbH, Karlsbad (DE)

( * ) Notice: Subject to any disclaimer, the term of this patent is extended or adjusted under 35 U.S.C. 154(b) by 1210 days.

(21) Appl. No.: 09/758,552

(22) Filed: Jan. 11, 2001

(51) Int. Cl.
*H04B 1/18* (2006.01)

(52) U.S. Cl. .............................. 455/184.1; 455/166.1; 455/161.3; 455/186.1; 455/179.1

(58) Field of Classification Search .............. 455/161.3, 455/166.1, 166.2, 169.1, 192.2, 245.1, 250.1, 455/184.1, 197.1, 186.1, 179.1, 164.1, 192.3
See application file for complete search history.

(56) References Cited

U.S. PATENT DOCUMENTS

| | | | | |
|---|---|---|---|---|
| 4,291,414 A | * | 9/1981 | Kimura | 455/164.1 |
| 4,298,989 A | | 11/1981 | Someno et al. | |
| 4,357,712 A | * | 11/1982 | Kawakami | 455/161.3 |
| 4,387,469 A | * | 6/1983 | Miyazaki et al. | 455/161.3 |
| 4,509,203 A | * | 4/1985 | Yamada | 455/166.2 |
| 4,509,204 A | * | 4/1985 | Wile | 455/169.1 |
| 4,580,285 A | * | 4/1986 | Richards, Jr. | 455/161.3 |
| 5,212,818 A | * | 5/1993 | Fukami | 455/186.1 |
| 5,239,701 A | * | 8/1993 | Ishii | 455/180.1 |
| 5,438,688 A | * | 8/1995 | Masaki | 455/161.2 |
| 5,450,621 A | * | 9/1995 | Kianush et al. | 455/192.2 |
| 5,555,451 A | | 9/1996 | Kennedy et al. | |
| 5,613,230 A | * | 3/1997 | Gottfried et al. | 455/161.3 |

FOREIGN PATENT DOCUMENTS

| | | |
|---|---|---|
| DE | 44 41 794 | 7/1999 |
| WO | WO 99/49581 | 9/1999 |

* cited by examiner

*Primary Examiner*—Sonny Trinh
(74) *Attorney, Agent, or Firm*—O'Shea. Getz & Kosakowski, P.C.

(57) ABSTRACT

The invention relates to a method for automatically finding an AM radio program, by which an AM radio receiver is tuned through in discrete steps, such that, for each set AM frequency, the reception quality at the currently set AM frequency is determined, the field strength of the neighboring frequencies is measured. If a significant field strength is detected at the neighboring frequencies, these are taken into account in determining the overall reception quality, in that the reception quality is reduced by a noise value, and subsequently the overall reception quality is compared with an upper quality limit. If the upper quality limit is exceeded, the program search is interrupted, and the AM radio program with this high overall reception quality is played. This method succeeds in reducing the number of misjudgments of AM radio programs with actually poor quality, and thus improves the reproduction quality of an AM radio receiver.

16 Claims, 1 Drawing Sheet

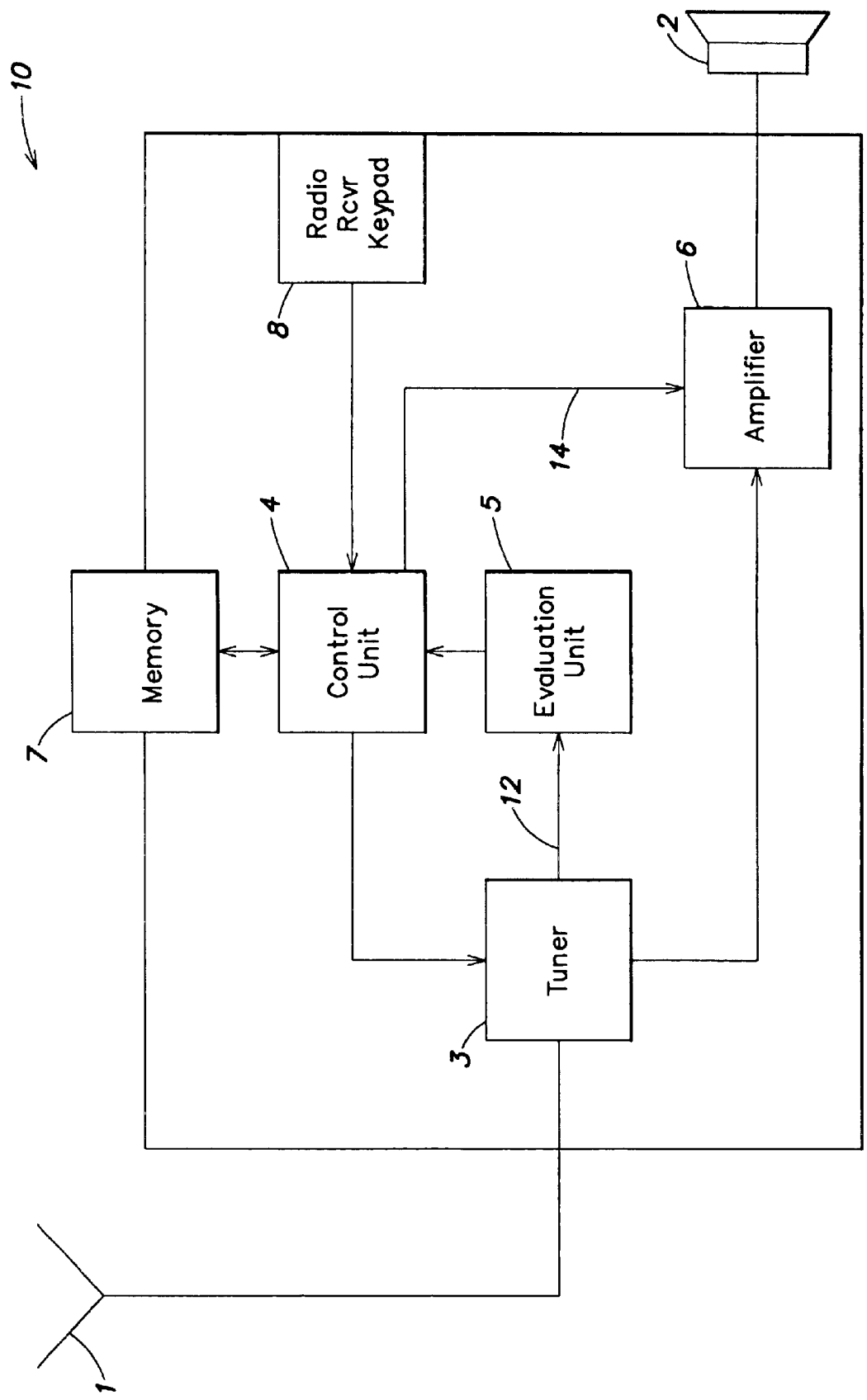

APPARATUS FOR AUTOMATICALLY FINDING AN AM RADIO PROGRAM

BACKGROUND OF THE INVENTION

The present invention relates to the field of radio tuners, and in particular to automatically identifying channels within an AM radio band that include valid audio data.

Conventional AM radio receivers often include the ability to automatically search for radio programs in the AM radio band. The receiver is tuned in discrete steps through the entire AM radio band, and the received field strength at each tunable frequency is determined to provide a measure of the reception quality at that frequency. If the reception quality exceeds a prescribed threshold, the program search is interrupted and the AM radio receiver is set to this radio program.

If the reception quality at the set AM frequency is less than the prescribed threshold, the through-tuning process is continued until either an AM radio program with adequate reception quality is found, or the entire AM radio band has been searched.

A problem with the prior art techniques of finding an AM radio program is that the determination of whether or not a channel includes audio is based solely upon the signal associated with that particular channel. This often leads to erroneously identifying a channel as including valid audio, when in fact the signal on the channel is associated with noise rather than valid audio. Neighboring AM radio channels often spill over to the AM radio channel being investigated, and not only interfere with the signal there but even simulate an AM radio signal with especially high field strength and thus with presumably high reception quality.

Therefore, there is a need for a technique for automatically identifying AM radio band channels that include valid audio.

SUMMARY OF THE INVENTION

Briefly, according to an aspect of the present invention, a radio receiver system includes an automatic tuner that scans through the frequency band of interest, and determines channels within the band that include valid audio data. The tuner measures the signal strength at a certain channel frequency, and at adjacent frequencies to the certain channel frequency. If there is signal energy indicative of noise at the adjacent frequencies, a noise value is subtracted from the measured signal strength of the first desired frequency to provide a corrected measured signal strength value, which is compared against a threshold to determine if valid audio data is present at the first desired frequency.

The radio receiver system is preferably an AM radio receiver system.

The AM radio receiver system automatically determines if valid audio data is present at an AM frequency, by measuring the signal strength at the AM frequency and at AM frequencies neighboring the AM frequency. If an AM radio signal with noticeable field strength is found on the immediately neighboring AM frequencies, this is taken into account in determining the overall reception quality, by reducing the actual reception quality at the AM frequency being investigated by a noise value. If no field strength is observed at the neighboring frequencies, the overall reception quality is set equal to the reception quality. In this case, there is no reduction due to AM signals received on the neighboring channels.

The AM radio receiver includes memory for storing data regarding the field strengths and reception qualities. These stored values are taken into account in evaluating an overall reception quality, especially as regards the field strength at the neighboring reception frequencies. Not only the immediately neighboring AM reception frequencies are taken into account, but preferably all the neighboring AM reception frequencies in a range of 2 kHz above and below the investigated AM reception frequency. By storing and evaluating the stored quality values and field strengths, the overall quality evaluation of the investigated AM frequencies approaches the actual reproduction quality of the AM radio program. The evaluation of the overall reception quality takes into account the neighboring frequencies beyond the nearest neighbor frequencies. The more remote frequencies are preferably weighted less, a smaller noise value being assigned to them, so that their lowering effect is also less.

Therefore, with this optimized evaluation of the quality of received radio signals, an AM radio receiver system identifies AM radio programs with good reception quality, thus considerably reducing the likelihood that radio programs with poor reception quality will be erroneously identified as including valid audio data. In particular, the inventive method is not so greatly subject to an interference which simulates better reception quality in the investigated, currently set AM radio channel (AM frequency), since reception signals or a portion of the reception field strengths of the neighboring AM radio channels spill over to the AM radio channel being investigated, and not only interfere with the signal there but even simulate an AM radio signal with especially high field strength and thus with presumably high reception quality. Consequently, the invention discloses a method for automatically finding an AM radio program, which bases its evaluation and the further procedure on the actual quality of the AM radio program.

In one embodiment, the radio receiver system tunes through the AM frequency band until a radio program with sufficient overall reception quality has been found. The AM radio receiver is then set to the AM reception frequency of the radio program with adequate overall reception quality, so that the user can listen to this AM radio program.

In another embodiment, the radio receiver system automatically tunes through the entire AM frequency band to check the individual AM radio frequencies for valid audio data. The AM reception frequencies with adequate overall reception quality (i.e., valid audio data—taking into account a possible noise value which lowers the reception quality) are stored. These frequencies can be retrieved and the AM radio receiver can be tuned to them by actuating an appropriate key on the AM radio receiver. The AM radio programs preferably are assigned to individual keys of the AM radio receiver as a function of their overall quality. The AM radio programs with their associated overall quality values are stored in an AM radio program memory. This AM radio program memory includes information about the AM radio frequency, either in the form of a tuning voltage required for tuning this frequency or also in the form of a discrete frequency specification and the associated reception quality value, which takes into account the reception situation on the neighboring reception frequencies using a reductive noise value.

The through-tuning process preferably is continued without measuring the field strength at the neighboring AM frequencies if the reception quality falls below a lower threshold. In this case, investigation of the neighboring frequencies can be skipped, and the next AM reception frequency can be investigated directly, to speed up the automatic tuning. The reception quality preferably is determined in terms of the received field strength at the AM reception frequency being investigated. The field strengths of the already investigated AM frequencies that have been found during the through-tuning process may be stored, and taken into account when evaluating the reception quality of a reception frequency that is being investigated. They are taken into account in the form of a noise value if a sufficient reception field strength exists on neighboring, previously investigated AM frequencies.

In addition to determining the reception quality of the AM radio frequency under investigation in terms of the field strength signal at this frequency, the radio receiver system may check whether the field strength signal varies in time. If it varies considerably in time, the through-tuning process is continued without further investigation and without consideration of the reception situation at the neighboring frequencies. This speeds up the speed of finding a radio program with adequate overall reception quality and also improves the process of finding a radio program with adequate quality and has less tendency to set the receiver to a noisy AM radio program.

To determine whether the reception signal of the investigated AM reception frequency changes in time, several random samples of the reception field strength of the investigated AM reception signal are taken shortly one after another at the relevant AM reception frequency, and the sampled values are compared. If the field strength of the random samples varies significantly, this indicates modulation of the AM radio signal at the AM frequency under investigation, so that this AM reception frequency cannot be used for playback. The next AM reception frequency is then investigated for its suitability to play back an AM radio program with adequate quality. The random samples preferably are taken at short intervals one after another, and their numbers preferably exceed three. Therefore, the presence of modulation can be reliably evaluated.

Advantageously, the AM radio receiver system identifies AM radio programs with good reception quality, thus considerably reducing the likelihood that radio programs with poor reception quality will be erroneously identified as including valid audio data. In particular, the inventive technique provides a radio receiver system that accurately identifies a channel as including valid audio.

These and other objects, features and advantages of the present invention will become more apparent in light of the following detailed description of preferred embodiments thereof, as illustrated in the accompanying drawing.

BRIEF DESCRIPTION OF THE DRAWING

The FIGURE illustrates an AM receiver system.

DETAILED DESCRIPTION OF THE INVENTION

An AM radio receiver system 10 includes an antenna 1 and a loudspeaker 2. The antenna 1 receives AM radio signals and provides a signal indicative thereof to an AM tuner 3. The AM radio receiver is controlled by a control unit 4, which commands the radio receiver to a radio reception frequency. In particular, the control unit 4 adjusts the AM tuner 3 to tune through the AM radio frequency band in discrete steps (e.g., ... $F_{n-1}$, $F_n$, $F_{n+1}$ ... ). The AM tuner 3 is also connected to a quality evaluation unit 5 that receives the received AM radio signal on a line 12 and determines the reception quality in a particular field strength of the received AM radio signal on the line 12 at the tuned AM radio frequency. The evaluation unit 5 provides the value of the reception frequency and the value of the measured field strength to the control unit 4.

If a desired radio program with adequate quality has been found and has been permanently set, the received AM radio signal processed by the AM tuner 3 is amplified in an amplifier stage 6. The amplifier stage provides an amplified signal to the loudspeaker 2, which converts this electrical audio signal into an acoustic audio signal. The amplifier 6 also receives a control signal on a line 14 from the control unit 4. The control signal on the line 14 is used to enable/disable muting of the amplifier 6 based upon the quality of the set AM radio program. That is, if the quality of the set AM radio program is not sufficient, the amplifier is muted. Similarly, if the quality of the set AM radio program is sufficient (i.e., the channel includes valid audio data), the muting is disabled and the amplified AM radio signal is presented to the loudspeaker. The control unit 4 has an associated read/write memory 7, in which the measured field strength and quality values are stored frequency-selectively, and retrieved as needed by the control unit 4.

The control unit 4 controls the AM radio receiver 3 to identify an AM radio program with adequate reception quality. Specifically, the control unit 4 commands the AM tuner 3 to tune through the AM frequency band in discrete steps. The reception situations on the neighboring reception frequencies (channels) $F_{n-1}$ and $F_{n+1}$ are taken into account when evaluating the reception quality of the AM radio frequency $F_n$. If a significant reception field strength is detected on the neighboring reception frequency, the directly measured reception quality at the investigated reception frequency $F_n$ is reduced by a fixed noise value. On the other hand, if no relevant reception field strength is present at the neighboring AM reception frequencies $F_{n-1}$, $F_{n+1}$, no such reduction is made. The reception quality reduced by the noise value, or the directly measured reception quality without reduction, represents the overall reception quality at the investigated AM reception frequency $F_n$. If this overall reception quality lies above a quality limit (i.e., a certain threshold value), this is a sufficient condition for stopping the program search. Consequently, the through-tuning process is discontinued, and the AM tuner 3 is set to this AM reception frequency $F_n$, or remains set there, and the amplifier 6 is switched out of the muted state. The received AM signal is thus conducted via the AM tuner 3 to the amplifier 6, which amplifies the electrical AM audio signal and conducts it to the loudspeaker 2, to be converted into an acoustic AM audio signal.

If the overall reception quality, with consideration of the reception situation at the neighboring AM frequencies, falls below the certain threshold value, the control unit 4 commands the AM tuner 3 to tune to the next AM reception frequency for investigation (i.e., from the frequency $F_n$ to the frequency $F_{n+1}$). These two frequencies differ by the discrete frequency difference given by the AM frequency grid, which is fixed by the AM frequency band. The AM frequencies are thus tuned in discrete steps corresponding to the measure of the AM frequency grid.

In evaluating the newly investigated AM reception frequency $F_{n+1}$, the previously determined reception quality and reception field strength data at its neighboring AM reception frequency $F_n$ is used, which is stored in the memory unit 7. Thus only the reception situation on the other directly neighboring AM reception frequency $F_{n+2}$ needs to be determined and taken into account in evaluating the overall reception quality of the AM reception frequency $F_{n+1}$. To determine the reception situation at the AM reception frequency $F_{n+1}$, the AM tuner 3 is briefly switched over to the AM reception frequency $F_{n+2}$, and the associated reception field strength is measured and stored in the memory unit 7. This measured field strength is then taken into account by the control unit 4 to determine the overall reception quality in the manner described above. If the control unit 4 takes much longer to evaluate the overall reception quality than the time needed to switch over to the investigated AM reception frequency $F_{n+1}$, the AM tuner 3 is reset to the investigated AM reception frequency $F_{n+1}$ after the reception field strength at the neighboring AM reception frequency $F_{n+2}$ has been determined. In this way, it is assured that when ascertaining an adequate overall reception quality, the amplifier 6 can immediately switch through to play the received AM radio program at the AM radio frequency with adequate overall reception quality.

However, if the evaluation process proves to be faster than the switch-over processes of the AM tuner 3, the AM tuner 3 is not immediately reset to the investigated AM reception frequency $F_{n+1}$. When the overall reception quality at the AM reception frequency $F_{n+1}$ is inadequate, this creates the precondition for quickly determining the overall reception quality at the neighboring AM reception frequency. This considerably speeds up the process of automatically finding AM radio programs with adequate reception quality.

Furthermore, the AM radio receiver can be operated in an AM radio program auto-store mode. In this mode, the entire AM radio band is tuned through step-by-step, and every AM reception frequency is investigated for its overall reception quality, that is its reception quality takes into account the reception situation on its neighboring reception frequencies. The ascertained overall reception quality at each AM reception frequency is then stored, as a function of quality, in the AM program memory which coincides with the memory unit 7. Therefore the AM reception frequencies of the AM radio programs with the highest overall qualities can be retrieved from the memory unit 7. The AM radio programs with the best overall reception qualities are assigned to a station key on the key panel 8 of the radio receiver. When a key is actuated, its corresponding AM reception frequency radio program is retrieved from the memory unit 7 by the control unit 4, and the control unit 4 sets the AM tuner 3 to the AM radio frequency of this AM radio program, which is then played on the loudspeaker 2.

Although the present invention has been shown and described with respect to several preferred embodiments thereof, various changes, omissions and additions to the form and detail thereof, may be made therein, without departing from the spirit and scope of the invention.

What is claimed is:

1. A radio receiver system, comprising:
   an RF tuner that receives a broadband signal and provides a received radio signal associated with a certain channel $F_n$ in response to a command signal;
   a memory device;
   an evaluation unit that receives the received radio signal and determines the signal strength of the received signal, and provides a signal strength value indicative thereof; and
   a control unit that receives the signal strength value, reduces the value of the signal strength value based upon signal noise on a channel $F_{n-1}$ to provide a corrected signal strength value, and writes to the memory device a frequency signal value indicative of the certain channel $F_n$ and provide the command signal to tune the tuner to the certain channel $F_n$ when the corrected signal strength value is greater than a threshold value.

2. The radio receiver system of claim 1, where the RF tuner comprises an AM tuner.

3. The radio receiver system of claim 2, where the controller comprises means for reducing the signal strength value based upon signal noise on a channel $F_{n+1}$ to provide the corrected signal strength value.

4. A radio receiver system of claim 1, wherein the control unit reduces the value of the signal strength by a constant value based upon signal noise on a channel $F_{n-1}$ to provide the corrected signal strength value.

5. A method for automatically finding an AM radio program, by which an AM radio receiver is tuned through a frequency band in discrete steps, such that, for each set AM frequency, the reception quality at the currently set AM frequency is determined, the field strength of the neighboring frequencies is measured, and, if a field strength is detected at the neighboring frequencies, these are taken into account in determining the overall reception quality, in that the reception quality is reduced by a noise value, and subsequently the overall reception quality is compared with an upper quality limit, and, if the upper quality limit is exceeded; the through-tuning process of the AM radio receiver is stopped, and the AM radio receiver is set to the AM frequency with sufficient overall reception quality, while otherwise the through-tuning process is continued.

6. The method of claim 5, where the time behavior of the field strength signal is investigated and, if the AM frequency being investigated for its reception quality changes in time, the through-tuning process is continued without measuring the field strength at the neighboring frequencies, while otherwise the field strength at the neighboring frequencies is measured and they are taken into account for the overall frequency.

7. The method of claim 5, where to investigate the time behavior of the field strength signal, several random samples of this are taken and these are investigated for their variation, and, if significant variations exist, the through-tuning process is continued without measuring the field strength at the neighboring frequencies.

8. The method of claim 5, where to determine the overall reception quality, the neighboring frequencies are taken into account within a range of 2 kHz above and below the AM frequency which is being investigated for overall reception quality.

9. The method of claim 5, where the radio receiver is configured and arranged as an AM radio receiver.

10. The method of claim 5, where the radio receiver comprises an AM radio receiver.

11. A method for automatically finding and storing a radio program, by which a radio receiver is tuned through a frequency band in discrete steps, such that, for each set frequency, the reception quality at the currrently set frequency is determined, the field strength of the neighboring frequencies is measured, and, if a field strength is detected at the neighboring frequencies, these are taken into account in determining the overall reception quality, in that the reception quality is reduced by a noise value, and subsequently the overall reception quality is compared with an upper quality limit, and, if the upper limit is exceeded, the frequency with sufficient overall reception quality is sotred in radio program memory, and subsequently the through-tuning process, together with the evaluation of the overall reception quality, is continued until the entire frequency band has been tuned through, in such a way that the stored frequencies can be retrieved by actuating station keys on the radio receiver.

12. The method of claim 11, where after the reception quality has been determined, it is compared with a minimum quality value and, if the current reception quality is less than this minimum quality, the through-tuning process is continued without measuring the field strength at the neighboring frequencies, while otherwise field strength at the neighboring frequencies is measured, and they are taken into account for the overall reception quality.

13. The method of claim 12, where a memory unit stores the values of the field strength and/or of the reception quality and, during the through-tuning process, each frequeny is set and investigated once to determine the field strength and/or reception quality, and the field strength and/or reception quality is stored and is retrieved from the memory unit without being determined anew, if it is needed later on.

14. The method of claim 11, where the field strength is used as a measure of the reception quality.

15. The method of claim 11, where the radio receiver is configured and arranged as an AM radio receiver.

16. The method of claim 11, where the radio receiver comprises an AM radio receiver.

* * * * *

UNITED STATES PATENT AND TRADEMARK OFFICE
CERTIFICATE OF CORRECTION

PATENT NO. : 7,274,918 B1
APPLICATION NO. : 09/758552
DATED : September 25, 2007
INVENTOR(S) : Bernhard Albicker It is certified that error appears in the above-identified patent and that said Letters Patent is hereby corrected as shown below:

Column 6
Line 5, delete "wherein" and insert --where--
Line 9, delete "an AM" and insert --a--
Line 10, delete "an AM" and insert --a--
Line 11, delete "AM"
Line 12, delete "AM"
Line 20, delete "AM"
Line 21, delete "AM"
Line 22, delete "AM"
Line 25, delete "AM"
Line 40, delete "AM"
Line 50, delete "currrently" and insert --currently--
Line 58, delete "sotred" and insert --stored--

Column 7
Line 3, before "field" insert --the--
Line 8, delete "frequeny" and insert --frequency--

Signed and Sealed this

Eighteenth Day of December, 2007

JON W. DUDAS
*Director of the United States Patent and Trademark Office*